(12) United States Patent
Azam et al.

(10) Patent No.: US 11,335,428 B2
(45) Date of Patent: May 17, 2022

(54) METHODS, SYSTEMS AND APPARATUS FOR IN-FIELD TESTING FOR GENERIC DIAGNOSTIC COMPONENTS

(71) Applicant: Intel Corporation, Santa Clara, CA (US)

(72) Inventors: Asad Azam, Folsom, CA (US); R Selvakumar Raja Gopal, Tapah (MY); Sreejit Chakravarty, Santa Clara, CA (US); Kaitlyn Chen, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/155,606

(22) Filed: Oct. 9, 2018

(65) Prior Publication Data

US 2019/0051370 A1 Feb. 14, 2019

(51) Int. Cl.
*G11C 29/42* (2006.01)
*G11C 29/36* (2006.01)
(Continued)

(52) U.S. Cl.
CPC .............. *G11C 29/42* (2013.01); *G11C 29/36* (2013.01); *G01R 31/3177* (2013.01); *G01R 31/31703* (2013.01); *G01R 31/31813* (2013.01); *G01R 31/318385* (2013.01); *G01R 31/318566* (2013.01); *G06F 11/16* (2013.01);
(Continued)

(58) Field of Classification Search
CPC ...... G06F 11/16; G06F 11/263; G06F 30/333; G01R 31/3177; G01R 31/318385; G01R 31/31813; G01R 31/318566; G01R 31/31703; G11C 2029/3602; G11C 29/42
See application file for complete search history.

(56) References Cited

U.S. PATENT DOCUMENTS

| 5,497,079 A * | 3/1996 | Yamada ................. G11C 29/56 324/756.07 |
| 5,515,383 A * | 5/1996 | Katoozi ......... G01R 31/318385 714/732 |

(Continued)

*Primary Examiner* — April Y Blair
*Assistant Examiner* — Sazzad Hossain
(74) *Attorney, Agent, or Firm* — Spectrum IP Law Group LLC

(57) ABSTRACT

The disclosed embodiments relate to method, apparatus and system for testing memory circuitry and diagnostic components designed to test the memory circuitry. The memory may be tested regularly using Memory Built-In Self-Test (MBIST) to detect memory failure. Error Correction Code (ECC)/Parity is implemented for SRAM/Register Files/ROM memory structures to protect against transient and permanent faults during runtime. ECC/Parity encoder and decoder logic detect failure on both data and address buses and are intended to catch soft error or structural fault in address decoding logic in SRAM Controller, where data may be read/written from/to different locations due to faults. ECC/parity logic on the memory structures are subject to failures. In certain exemplary embodiments, an array test controller is used to generate and transmit error vectors to thereby determine faulty diagnostic components. The test vectors may be generated randomly to test the diagnostic components during run-time for in-field testing.

25 Claims, 5 Drawing Sheets

(51) Int. Cl.
   *G11C 29/04*      (2006.01)
   *G01R 31/3177*    (2006.01)
   *G06F 11/16*      (2006.01)
   *G01R 31/317*     (2006.01)
   *G01R 31/3183*    (2006.01)
   *G01R 31/3181*    (2006.01)
   *G06F 11/263*     (2006.01)
   *G06F 30/333*     (2020.01)
   *G01R 31/3185*    (2006.01)

(52) U.S. Cl.
   CPC .......... *G06F 11/263* (2013.01); *G06F 30/333* (2020.01); *G11C 2029/0409* (2013.01); *G11C 2029/3602* (2013.01)

(56) References Cited

U.S. PATENT DOCUMENTS

| | | | |
|---|---|---|---|
| 8,001,434 B1 | 8/2011 | Lee et al. | |
| 8,566,645 B2 | 10/2013 | Rentschler et al. | |
| 9,384,856 B2* | 7/2016 | Spruth | G06F 11/263 |
| 2005/0182997 A1* | 8/2005 | Kushida | G11C 29/42 |
| | | | 714/763 |
| 2017/0187807 A1* | 6/2017 | Clernon | H04W 4/70 |
| 2018/0047458 A1* | 2/2018 | Bucksch | G11C 29/38 |

\* cited by examiner

METHODS, SYSTEMS AND APPARATUS FOR IN-FIELD TESTING FOR GENERIC DIAGNOSTIC COMPONENTS

BACKGROUND

Functional Safety (Fu-Sa) is the part of the overall safety of a system or an equipment that depends on the system or equipment operating correctly in response to its inputs. Fu-Sa includes safe management of likely operator errors, hardware failures and environmental changes. The goal of Fu-Sa is to arrange products in a way that they are verifiably free of unacceptable risks. Typical Fu-Sa products are electronic systems which are used, for example, in vehicles, airplanes, hospitals or medical devices.

Self-test by software, also known as Software Test Library (STL), is a method for providing diagnostic coverage for safety-related integrated circuits (ICs). An STL is an SW program which is periodically executed in the field by a processing unit. One goal of the STL is to act as an information provider. To this end, it may act as a bridge for diagnostic information. STLs are suitable for circuits that have limited or no hardware (HW) diagnostic measures and may also be used to complement safety mechanisms of integrated circuits that have HW support for safety.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
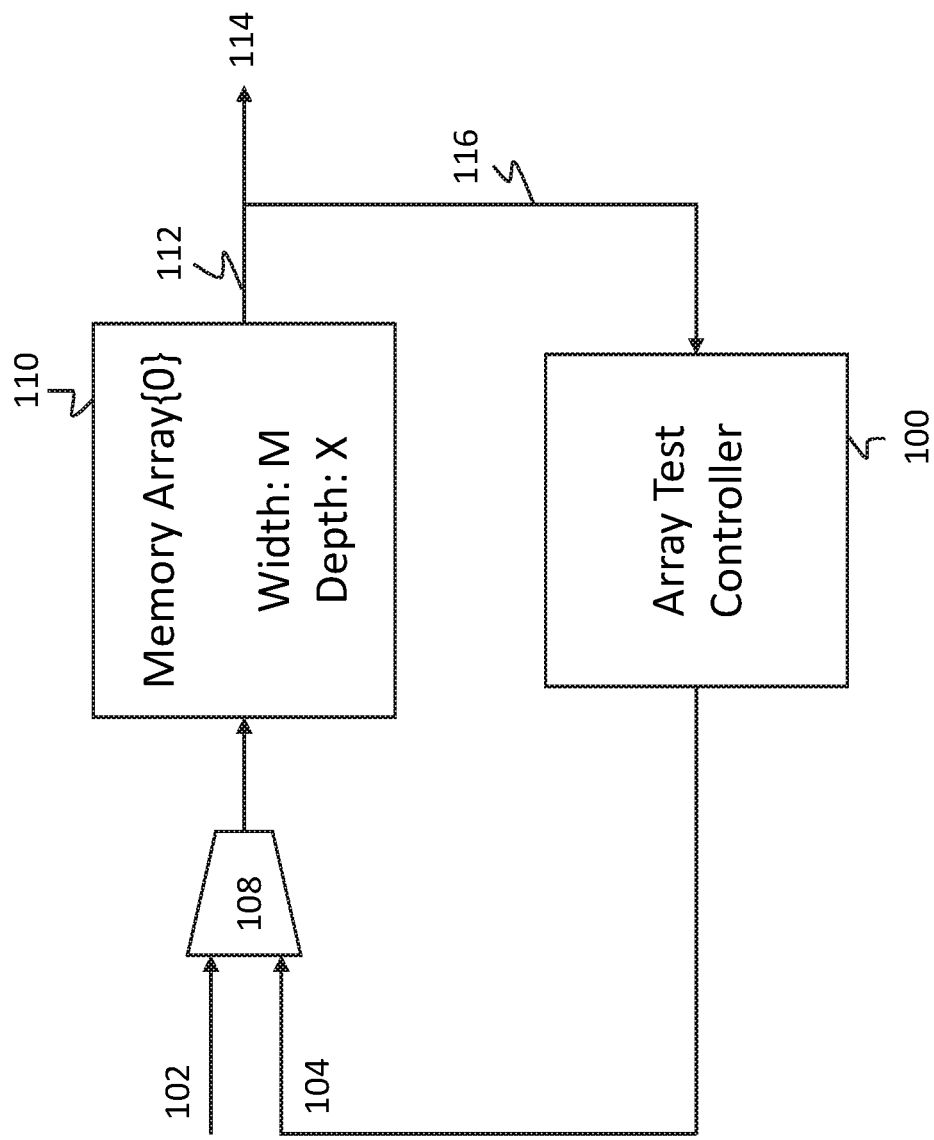
FIG. 1 is a schematic illustration of a conventional memory array in an IOT system.

Functional safety (FuSa) is important for the real time complex systems in Internet of Things (IOT) applications like automotive and industrial segments. All these applications imposed tighter constraints on the system to perform safely and reliably under complex and noisy system environment across products life cycle time. For such applications, FuSa mechanisms are vital to detect latent and single-point faults in-field.

In Functional safety applications On-demand FuSA diagnostic mode can be triggered in-field (post production functional mode). One of the latent fault test required to execute in most of the safe applications is to execute in-field diagnostic safety mechanisms on memory structures to detect structural faults in the memory arrays.

Error Correction Code (ECC)/Parity is implemented for SRAM/Register Files/ROM memory structures to protect against transient and permanent faults during runtime. Error Correction Code (ECC) is implemented for SRAM/Register File memory structures to protect against transient and permanent faults during runtime operations. ECC encoder and decoder logic detect failure on both the data and address buses and are intended to catch soft error or structural faults. ECC is calculated during memory write accesses and written back into the SRAM/Register Files memory structures. On the read operation ECC is recomputed, compared against the stored value and faults are detected/reported. However for ROM arrays ECC is calculated on read which is then compared against the preloaded ECC syndrome.

A built-in self-test ("BIST") is a mechanism that permits a machine to test itself. BIST is used to ensure high reliability and lower repair cycle time. A key purpose of BIST is to reduce complexity and decrease cost. BIST also reduces the need for external testing.

Memory Built-In Self-Test ("MBIST") on memory array structures are executed on most of the Memory components (SRAMs, Register Files and ROMs) for safety related applications. Built-in self-test ("BIST") circuitry implemented on memory structures detecting structural faults; for example, address decoding faults, stuck-at faults, and transient faults with a high level of coverage. MBIST is implemented and executed to detect a permanent structural faults, however failure can also occur due to transient/random faults.

A parity check is the process that ensures accurate data transmission between nodes during communication. In the conventional parity check, a parity bit is appended to the original data bits to create an even or odd bit number so as to produce the number of bits with value one. Error-correcting code ("ECC") memory is a type of computer data storage that can detect and correct the most common kinds of internal data corruption. ECC memory is used in most computers where data corruption cannot be tolerated under any circumstances, such as for scientific or financial computing.

Safety mechanism components logic (such as ECC/parity logic on the memory structures) are themselves subject to failures. These components can be on the memory structures or other non-memory structures. Hence, safety mechanism components logic are expected to be tested for structural faults as part of the on-demand in-field diagnostics. The so-called Check the Checker (CTC) capability on the safety mechanism components logic are implemented for any structural faults by using error injection and path coverage. There are significant challenges for enabling such diagnostics in-field.

The instant disclosure provides FuSa diagnostic apparatus and method for in-field and in-system testing of the Memory arrays and associated ECC/Parity logic. In one embodiment, the disclosed diagnostics for memory and ECC/Parity logic are parallelized to reduce the test execution time for functional safety critical applications. This is important, particularly taking into account the sensitivity to overall boot time (such as in automotive). In an exemplary embodiment, the so-called In-built Safety Island ("IBSI") engine is able to log (store) and generate the error reports which is used by Application software to detect system errors. In another exemplary embodiment, an IBSI engine is capable to configure system under recovery state or park under safe state depending on the error categorization.

Conventional systems lack any mechanism to execute CTC on ECC/Parity logic using MBIST vectors. Consequently, the lack enhanced diagnostic coverage. A significant disadvantage of the conventional systems is the loss of diagnostic coverage on the ECC/parity and longer time to execute. Another significant disadvantage is system failure.

Thus, in one embodiment, the disclosure utilizes the MBIST controller to provide and/or generate test vectors for both memory and ECC/Parity. MBIST controller is generally available in safety critical electronic components, also known as IP, as a core engine. The disclosed embodiment allows error and results to be logged into one or more local registers. Further action may be taken by the electronic component (IP) or by the SoC safety controller. The proposed embodiments allow both ECC/Parity to be tested in parallel, thereby shortening the amount of time required for safety critical IP to complete the diagnostic phase.

The disclosed embodiments also provide a hardware based solution which utilizes MBIST engine to concurrently test any critical diagnostic components which are test time sensitive in safety applications. The disclosed embodiments are particularly suitable for memory subsystems. The disclosed embodiments may comprise a self-sustained system which does not require any kind of platform level components and can result in saving platform cost. The disclosed embodiments provide low cost a System-On-Chip ("SOC") solution for various IOTG/Real Time systems by meeting SOC safety requirement and providing by Safety guidelines.

FIG. 1 is a schematic illustration of a conventional memory array in an IOT system. In FIG. 1, multiplexer 108 receives input signals 102 and 104. Input signal 102 represents functional mode path. The functional mode path may be an incoming signal vectors that is directed for a write operation to memory 110.

Signal 104 is the output of array test controller 100. Array test controller may issue test vectors directed to memory array 110. Test vectors 104 may be randomly generated to test viability of memory array 110. Array test controller 100 may be configured for BIST or MBIST. Array test controller 100 may define an MBIST controller block, or interchangeably, MBIST engine.

Memory array 110 may be a conventional memory. In the exemplary embodiment of FIG. 1, memory array 110 may define an SRAM, RF, ROM and the like. Memory array 110 my include M rows and X columns.

Memory array 110 can receive an input signal from functional path 102 for a sequence of write operations. Memory array 110 may also receive one or more test vectors from signal 104. The test vectors of signal 104 may comprise randomly generated test vectors to test efficacy of one or more registers (not shown) of memory array 110.

Both inputs 102 and 104 are received at memory array 110. Output signal 112 of memory array 110 is a read operation and may be directed to a multiplexer (not shown) to be forwarded to a decoder (not shown). Read signal 116 is derived from output 112 and is re-directed back to controller 100. Array test controller 100 then compares Read signal 116 with the expected value which was written to the same memory location to detect and identify any errors in memory array 110.

As stated, an embodiment of the disclosure provides a hardware based solution which utilizes MBIST engine to concurrently test any critical diagnostic components which are test time sensitive in safety applications. In one embodiment, the test mode includes latent fault detection mechanism in hardware (e.g., sequenced through finite state machine/software) which covers memory arrays and any diagnostic components which may be associated with memory array.

There may be multiple phases for running checks on the diagnostic logic leveraging the MBIST engine as disclosed herein.

In one embodiment, the disclosed principles are configured to avoid any impact on the memory array testing and to execute the test on diagnostic components concurrently. In another embodiment, the disclosed principle are configured for implementation in real-time and during run-time. To support in-field diagnostic mode for structural fault coverage, the disclosed embodiments provide an enhanced MBIST controller block.

In one embodiment, the enhancement may include self-diagnostic means to support check-the-checker operation using MBIST data/address vectors and executed in parallel to the memory testing. In such embodiments, the ECC/Parity hardware Built-In Self-Test can be executed concurrently while MBIST controller is testing the arrays. An advantage of this is that while testing parameter and scope are enhanced, the test time is not extended. Thus, testing of the ECC/Parity logic can be completed along with the testing of the memory array.

In one implementation, the error bits from the ECC/Parity decoder are fed back to the BIST controller which monitors these bits and determines if an error has occurred. Results are reported through appropriate error reporting signals or logged into register for safety controller to extract the result at later point of the diagnostic flow. Further action may follow if the results indicated faulty ECC/Parity check.

In one embodiment, simple address decode mechanism is defined to allow N-number of phases to run in same MBIST run cycle. Having known the demarcation of address lines when each phase will run (e.g., easy approach will be to tap the address and run phase N in first 1/N of the address space). Where the demarcation points for each phase are tapped may be based on the test modes.

Figure 2:
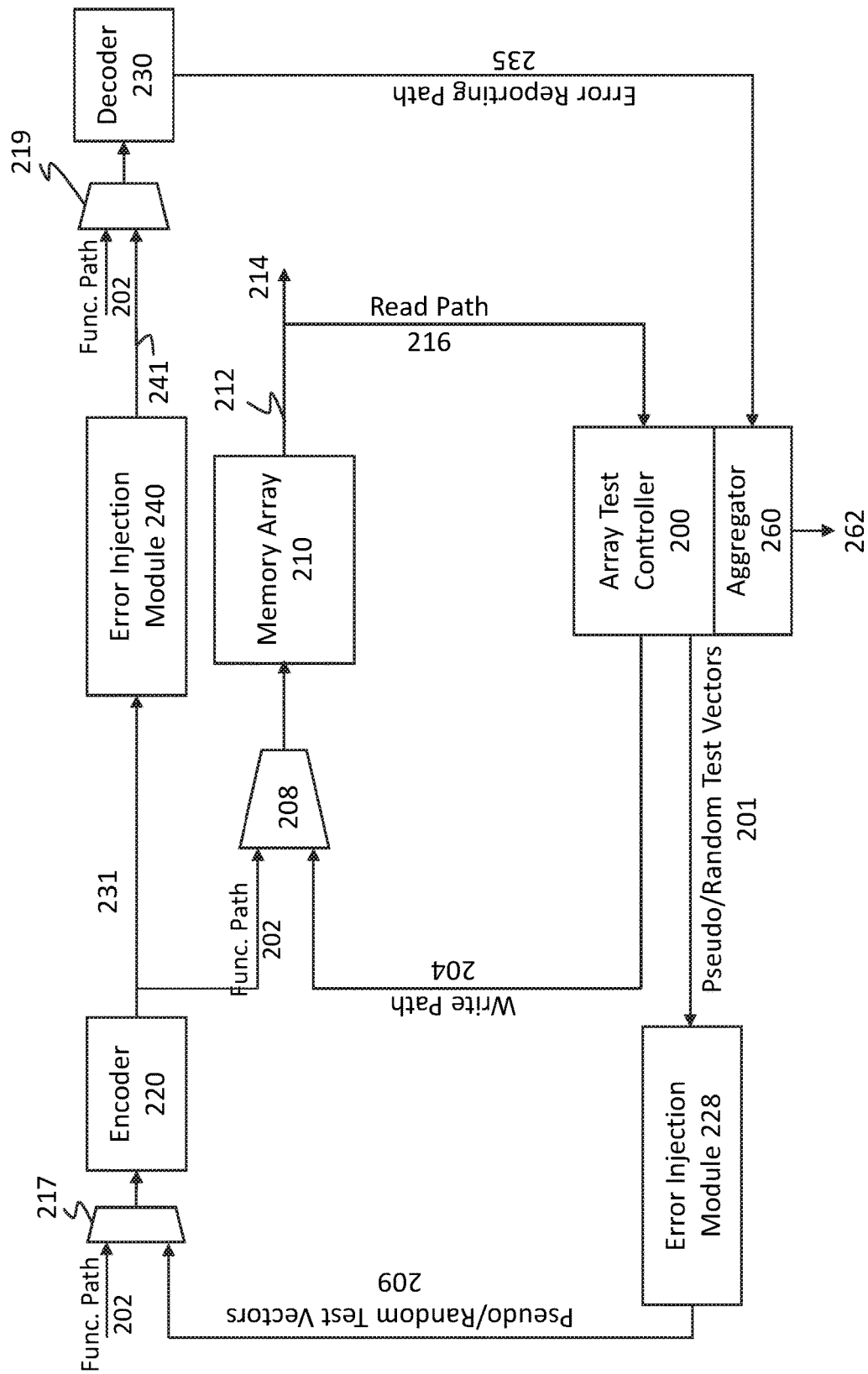
FIG. 2 illustrates an exemplary MBIST controller 200 according to one embodiment of the disclosure.

FIG. 2 illustrates an exemplary MBIST controller 200 according to one embodiment of the disclosure. In FIG. 2, memory array 210 may be a conventional memory array as described in relation to FIG. 1. Array test controller 200 may define an MBIST controller consistent with the disclosed embodiments. Array test controller 200 may be configured to generate random test vectors and pseudo random test vectors. Specifically, in the exemplary embodiment of FIG. 2, MBIST controller 200 sends pseudorandom vectors into memory array 210 (through path 204) as well as sending random vector arrays to ECC encoder 220 (through paths 201, 209 and 241) and ECC decoder 230. The returning information from paths 216 and error reporting path 235 are received at MBIST controller 200 and aggregator 260 to identify potential errors not just at memory 100, but also at ECC components (ECC encoder 220 ECC decoder 230).

In an exemplary embodiment, the enhanced diagnostic is implemented during runtime (during operation of the components) and in real-time. The random and pseudorandom test vectors identified above are injected into the ECC logic or parity logic which serve memory 210. This enhances the diagnostic coverage for the tested components because it allows testing of the ECC logic or parity logic (CTC) in addition to the conventional testing of the memory arrays as discussed with respect to FIG. 1. By randomizing the generated test vectors to test the ECC logic, more test vectors will be directed or injected to the diagnosed components which heretofore have not been tested. The randomized test vectors are in addition to the pseudorandom MBIST test vectors (see path 204) that are conventionally sent to test the memory array.

The random test vectors (201, 209, 241) may be configured according to one embodiment of the disclosure to test encoder 220 and decoder 230. Other components may be tested equally without departing from the disclosed principles. The disclosed applications enable expanding the scope of coverage to get more test vectors into different components during runtime and without expanding the test suite (which is limited during runtime). Such components may include different diagnostic components which are traditionally untested. Exemplary components may include components that are traditionally used to implement diagnostics of the system itself, for example, encoders, decoders, ECC and Parity checks which are conventionally left untested.

Error injection modules 228 and 240 may be configured to inject error vectors (error test vectors) 209, 241, respectively into the system of FIG. 2. Error injection modules 228 and 240 may inject vectored errors or non-vectored errors. Error injection modules may define one or more Field-Programmable Gate Arrays (FPGA). In one embodiment, injection modules 228 and 240 may inject vectored errors into the various IOT components. In another embodiment, the vectored errors are injected randomly. In still another embodiment, the error injection modules concatenate data including intentional error bits to produce an error vector.

The source data coming out of the array test controller is branched off to multiple sink points. In one embodiment, the error code is injected only at particular sink point (just before the decoder). For this reason, it is shown outside of the array test controller. However the control signals are driven by the array test controller.

Functional data paths 202 represent the functional data path to memory array 210 similar to FIG. 1. Functional data paths 202 go through the same hierarchy (i.e., writing into and reading from the memory) of logic as the test path. Functional data paths 202 is inputted into encoded 220, decoder 230 and multiplexer 208. It should be noted that the embodiment shown in FIG. 2 is illustrative and non-limiting and the disclosed principles are not limited to inputting functional path into encoder, decoder and the multiplexer.

Encoder 220 may be a vectored or non-vectored diagnostic component encoder. Encoder 202 may be a conventional encoder. Similarly, decoder 230 may be a vectored or non-vectored diagnostic component decoder. In one embodiment, there can be "n" number of ECC/Parity; and, in the case of ECC "v" number of syndrome bits.

Memory array 210 may be substantially similar to memory array 110. Memory array 210 may receive an input signals 202 (functional mode path) and 204 (from array test controller) through multiplexer 208. In an exemplary embodiment, array test controller 200 sends constrained test vectors to memory array 210.

Error aggregator 260 can be optionally coupled to Array test controller 200. Error aggregator 260 may receive error reports from decoder 230 through error reporting path 235. The received errors may be collected, aggregated and logged at a table (not shown). The errors can be determined by comparing the randomly issued vectored error test and the received vector error tests from decoder 230. The results may be reported 262 for further action, such as, reporting to a user or reporting to a server. Other actions may be taken to repair the identified error source.

Multiplexers 217, 219 receive and multiplex input signals 202 and 209. The output of multiplexer 217 is directed to encoder 220. The output of multiplexer 219 is directed to decoder 230. Each of the multiplexer outputs includes an error bit. The error can be a single-bit error or multi-bit error. The error may be configured to test the ECC diagnostic components, which in FIG. 2, include Encoder 220 and decoder 230.

Error reporting path 235 directs the output of the encoder 220 and decoder 230 to aggregator 260. Aggregator 260 compares the received outputs with the errors generated by the error injection modules 228 and 240 to determine whether encoder 220 and decoder 230 detect the errors.

Figure 3:
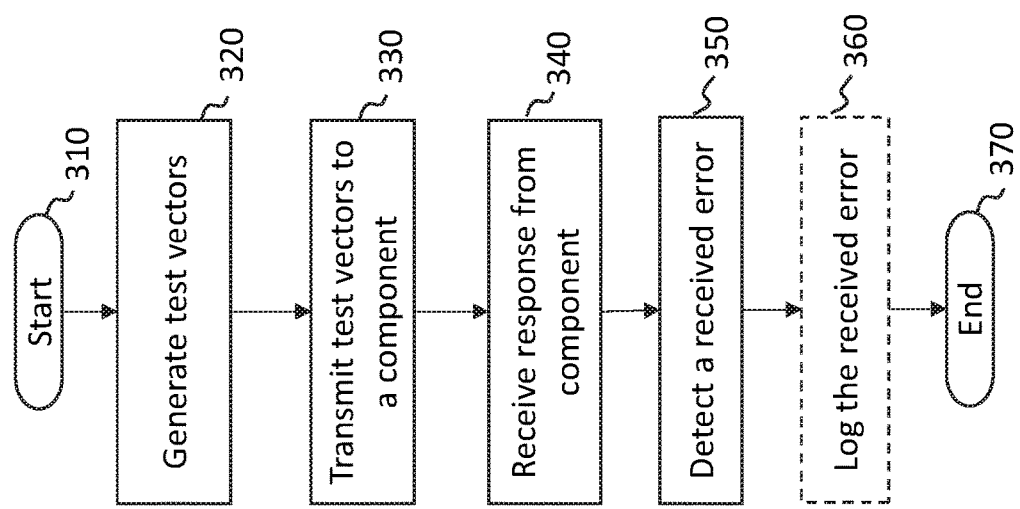
FIG. 3 is an exemplary flow diagram according to one embodiment of the disclosure.

FIG. 3 is an exemplary flow diagram according to one embodiment of the disclosure. The embodiment of FIG. 3 may be implemented to test diagnostic components of an FuSa device in an IOT. In one implementation, the flow diagram of FIG. 3 is implemented at an MBIST. In another embodiment, the flow diagram of FIG. 3 is implemented at an array test controller. The MBIST or the array test controller may be part of a logical memory structure. The MBIST or the test array may be configured to test the memory as well as the diagnostic components associated with the memory. Such diagnostic components may include ECC and Parity.

At step 310, the flow diagram starts. At step 320, one or more test vectors are generated at an array test controller. The test vectors may be configured to test the memory array as well as diagnostic components associated with the memory array. In certain implementation, the test vectors may be configured to test single bit errors in the diagnostic components. In another embodiment, the test vectors may be configured to test multi-bit errors in the diagnostic component. In still another embodiment, the may inject random patterns in the ECC logic without any errors.

The test vectors may be generated randomly and/or pseudo-randomly. In one embodiment, the test vectors configured to test MBIST are pseudo randomly generated. In another embodiment, the test vectors configured to test diagnostic components are randomly generated.

In certain embodiments, an address space may be subdivided into three portions. One-third of the address array may be dedicated to injecting random pattern in the ECC logic without errors; a second one-third may be for injecting random patterns with single bit errors; and the last one-third may be used for injecting random patterns with multi-bit errors.

In step 330, the test vectors are transmitted to one or more components. The test vectors may test for single bit error and/or multi-bit error. The components may include one or more memory array and diagnostic components configured to test the memory array. The test vectors may be generated by an array controller. In another embodiment, the test vectors may be processed through an error injection module and then directed to various diagnostic components.

At step 340, a response to the test vector(s) is received from the component under study. The response may indicate that the component under study is properly functioning or the response may indicate otherwise. In one embodiment, the output of the device under study is compared with the input test. The comparison may be done at, for example, an array test controller. The result of the comparison may indicate a received error as shown in step 350. In an optional embodiment, the received error may be logged or otherwise stored (either locally or remotely) as shown in step 360. The process ends at step 370.

The flow diagram of FIG. 3 may be repeated regularly during predefined time interval. Alternately, the flow diagram of FIG. 3 may be activated through a trigger (e.g., receiving an error indication, etc.)

The following design example is provided to illustrate an implementation of the disclosed principles. Specifically, the following example will illustrate how the mechanism is applied to memory array tests and testing the ECC/Parity diagnostic components associated with each memory. In this example, the execution phases are divided in three phases (N=3) which assumes ECC encoder and decoder logic (as the vectored Diagnostic Component).

Here, the ECC hardware leverages the MBIST engine to simplify the hardware overhead as follows: (A) Data driven into the ECC encoder is derived from the address bus generated by the MBIST controller; and (B) Start and done events of the MBIST logic is used as the start and done event of the ECC hardware BIST.

The entire address space is divided into three parts. Let A[N], A[N−1] be the most significant bit (MSB) and MSB-1 bits of the address bus respectively. The total run time for MBIST execution is based on the algorithm selection for in-field diagnostic. The vector generation (from MBIST engine) for the ECC/Parity components is divided into 3 phases within the same length of array test execution. Each of the phases are described below. Each phase is responsible to test the ECC/Parity hardware differently (without requiring more than what the array test would require).

Phase 1—Ensuring ECC/Parity will flag no errors when there are no errors. Running the diagnostic on the SRAM, ECC Encoder and ECC Decoder in parallel using the built in "Error! Reference source not found". The number of total iterations required for chosen algorithm would be the total number of cycles executed by the INIT flow. This phase covers the logic without any error injection.

MBIST INIT Flow—(a) BIST ALGO will provide {M+N}' bits of data to the SRAM (this is required for the SRAM memory array coverage for hard errors). This phase will run $\frac{1}{3}^{rd}$ of the total address depth (total MBIST run time for the selected algorithm); M is the width of the memory (X of memory) while N is the width of ECC/parity bits for each row.

ECC Gen Logic (CTC) Flow—(a) The M' from the (M+N)' bits which is from the MBIST scrambled address (to provide higher level of coverage) can be used by the ECC Encoder to generate the ECC codes, that is the N' bits. (b) The INIT flow is utilizing the M'-bits to allow ECC Encoder to be checked in parallel. The check for the ECC Encoder will also be executed for n-number of clock cycles depending on the INIT flow depth.

ECC Check logic (CTC) flow—(a) The INIT flow is utilizing the M'-bits to allow ECC Decoder to be checked in parallel. The ECC Decoder will also be executed for n-number of clock cycles depending on the INIT flow depth. (b) N' and M' bits are fed into the ECC Decoder multiplexers, where M' in phase I will not be injected with error bits. (c) Comparator function will check the results for every cycle: {M'==M"} where SERR, MERR are expected to be 0.

Phase 2—Ensuring ECC/Parity will flag single errors when there is single error. Running the diagnostic on the SRAM, ECC Encoder and ECC Decoder in parallel using the built in "Error! Reference error source not found". The number of total iterations required for chosen algorithm would be the total number of cycles executed by the INIT flow. This phase covers single bit error injection on non ECC data bits, detection and correction in the ECC Decoder using built in INIT flow. By way of example, functional data (pre-ECC encoder) can be 32 bits. ECC syndrome (Generated by ECC encoder) can be 8 bits. These two are appended together and the input to the decoder is 40 bit. In certain embodiments, single or multiple bit errors (of the 40 bit) can be injected on either functional data bits or the ECC syndrome bits or both.

MBIST INIT flow—BIST ALGO will provide {M+N}' bits of data to the SRAM (this is required for the SRAM memory array coverage for hard errors). This phase will run $\frac{1}{3}^{rd}$ of the total address depth (total MBIST run time for the selected algorithm), beginning on the $2^{nd}$.

ECC Gen logic (CTC) flow—(a) The M' from the (M+N)' bits which is from the BIST scrambled address (to provide higher level of coverage) will be used by the ECC Encoder to generate N' bits. (b) The INIT flow is utilizing the M'-bits to allow ECC Encoder to be checked in parallel. The ECC Encoder will also be executed for n-number of clock cycles depending on the INIT flow depth.

ECC Check logic (CTC) flow—(a) The INIT flow can utilize the M'-bits to allow ECC Decoder to be checked in parallel. The ECC Decoder will also be executed for n-number of clock cycles depending on the INIT flow depth. (b) N' and M' bits are fed into the ECC Decoder multiplexers, where M' in phase II is to inject single error bit into M' bits going into ECC Decoder. The Init flow will flip the bit using the error injection block which will ensure that the M' will have one error. (c) Comparator function to check the results for every cycle: {M' !=M"} where SERR=1, MERR is expected to be 0.

Phase III—Ensuring ECC/Parity will flag multi errors when there are multiple errors. Running the diagnostic on the SRAM, ECC Encoder and ECC Decoder in parallel using the built in "Error! Reference source not found". The number of total iterations required for chosen algorithm would be the total number of cycles executed by the INIT flow. This phase covers Multi-bit error injection and detection in the ECC Decoder using built in INIT flow.

(1) MBIST INIT flow—BIST ALGO will provide {M+N}' bits of data to the SRAM (this is required for the SRAM memory array coverage for hard errors). This phase will run ⅓rd of the 3rd address location.

(2) ECC Gen Logic (CTC) flow—(a) The M' from the (M+N)' bits which is from the BIST scrambled address (to provide higher level of coverage) will be used by the ECC Encoder to generate N' bits. (b) The INIT flow is utilizing the M'-bits to allow ECC Encoder to be checked in parallel. The ECC Encoder will also be executed for n-number of clock cycles depending on the INIT flow depth.

(3) ECC Check logic (CTC) flow—(a) The INIT flow is utilizing the M'-bits to allow ECC Decoder to be checked in parallel. The ECC Decoder will also be executed for n-number of clock cycles depending on the INIT flow depth. (b) N' and M' bits are fed into the ECC Decoder Mux'es, where M' in phase II is to inject double error bit into M' bits going into ECC Decoder. (c) Comparator function to check the results for every cycle: {M' !=M"} where SERR=X, MERR is expected to be 1.

Figure 4:
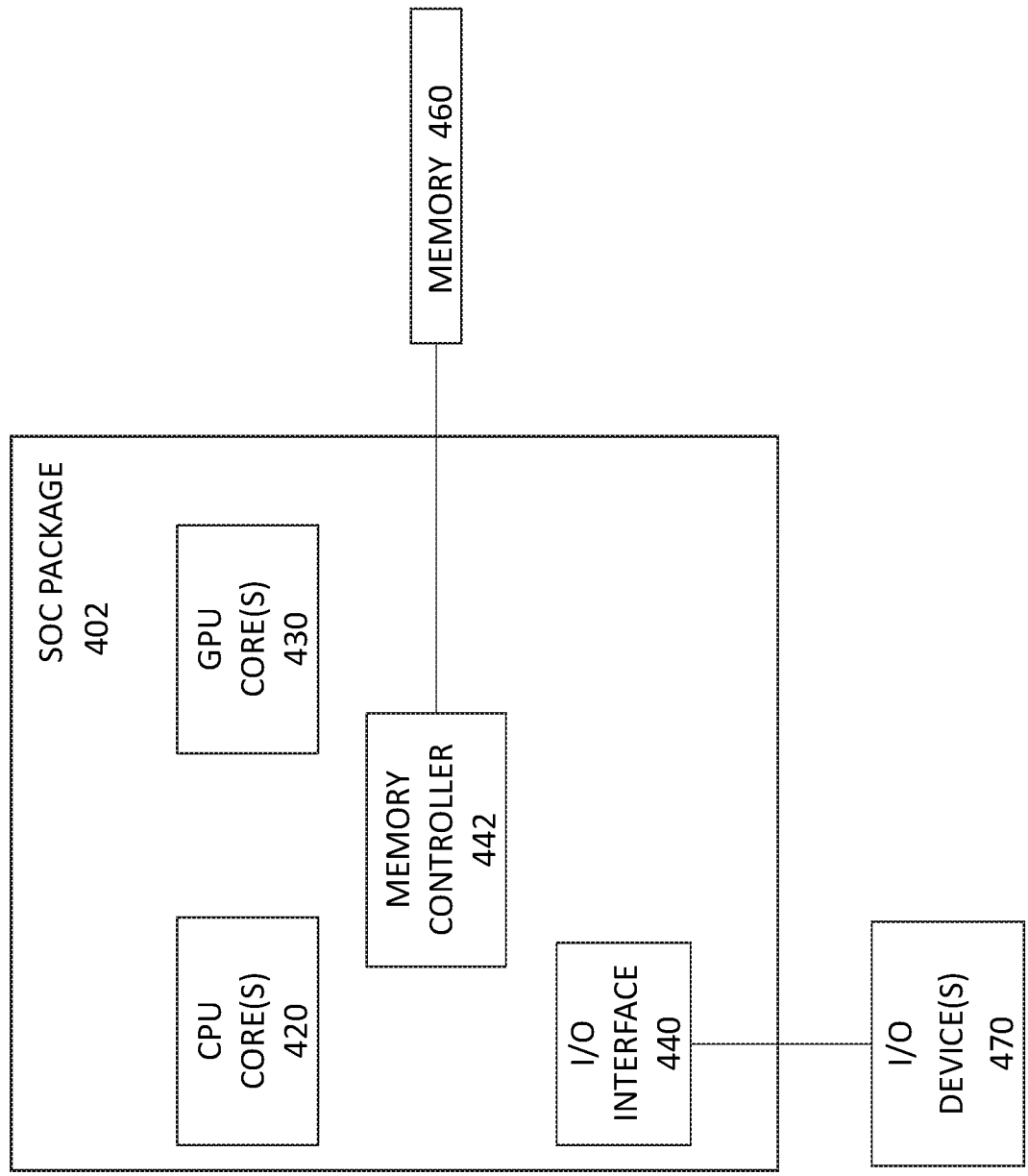
FIG. 4 illustrates a block diagram of an SOC package in accordance with an embodiment.

FIG. 4 illustrates a block diagram of an SOC package in accordance with an embodiment. By way of example, the disclosed principles for testing memory and diagnostic components may be implemented at the SOC package of FIG. 4. As illustrated in FIG. 4, SOC 402 includes one or more Central Processing Unit (CPU) cores 420, one or more Graphics Processor Unit (GPU) cores 430, an Input/Output (I/O) interface 440, and a memory controller 442. Various components of the SOC package 402 may be coupled to an interconnect or bus such as discussed herein with reference to the other figures. Also, the SOC package 402 may include more or less components, such as those discussed herein with reference to the other figures. Further, each component of the SOC package 420 may include one or more other components, e.g., as discussed with reference to the other figures herein. In one embodiment, SOC package 402 (and its components) is provided on one or more Integrated Circuit (IC) die, e.g., which are packaged into a single semiconductor device.

SOC package 402 is coupled to a memory 460 via the memory controller 442. In an embodiment, the memory 460

(or a portion of it) can be integrated on the SOC package 402. The I/O interface 440 may be coupled to one or more I/O devices 470, e.g., via an interconnect and/or bus such as discussed herein with reference to other figures. I/O device (s) 470 may include one or more of a keyboard, a mouse, a touchpad, a display, an image/video capture device (such as a camera or camcorder/video recorder), a touch screen, a speaker, or the like.

Figure 5:
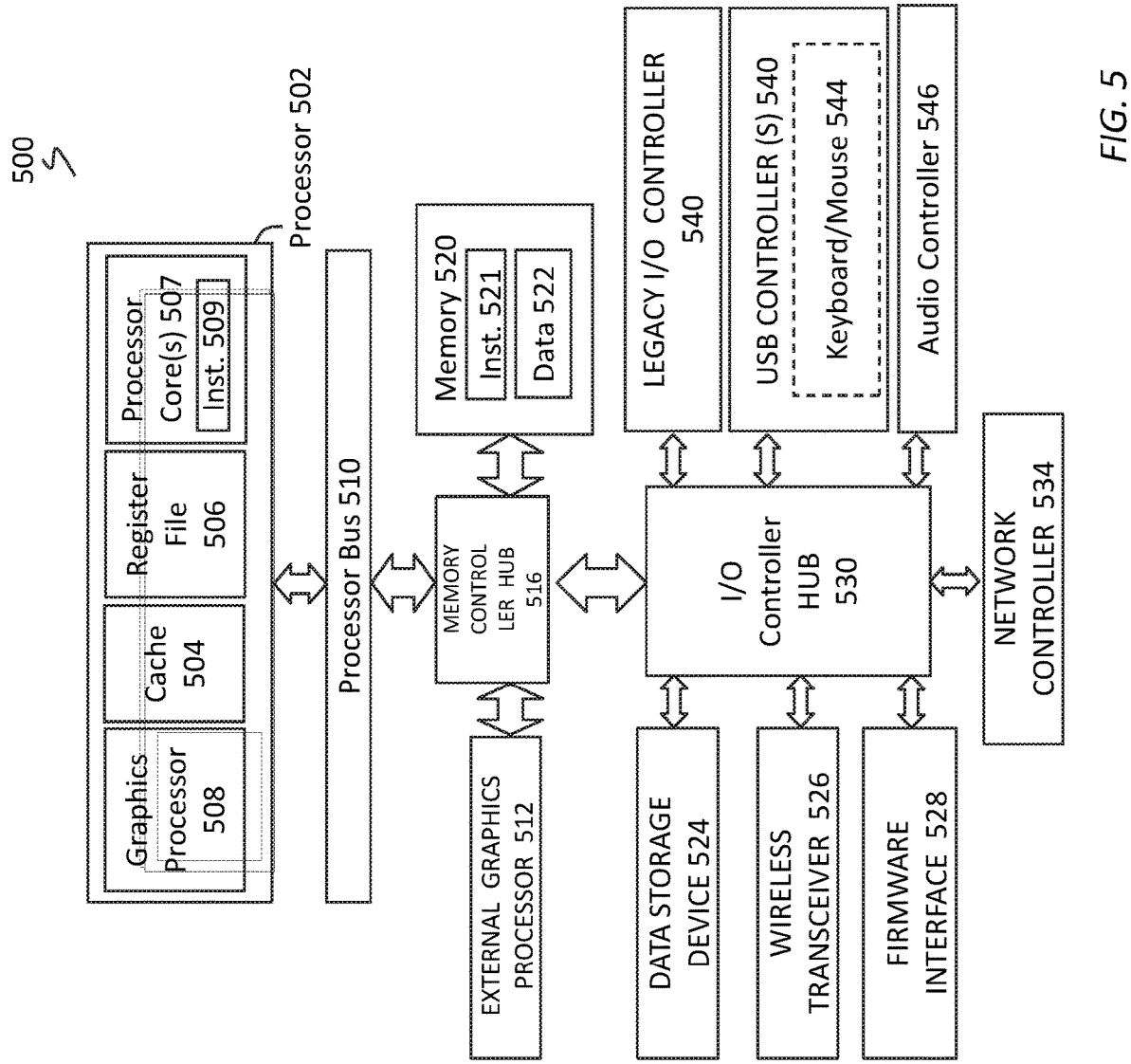
FIG. 5 is a block diagram of a processing system 500, according to an embodiment.

FIG. 5 is a block diagram of a processing system 500, according to an embodiment. The disclosed principles can be implemented in system 500, for example, to detect faulty memory or to detect faulty diagnostic components of the system. In various embodiments the system 500 includes one or more processors 502 and one or more graphics processors 508, and may be a single processor desktop system, a multiprocessor workstation system, or a server system having a large number of processors 502 or processor cores 507. In on embodiment, the system 500 is a processing platform incorporated within a system-on-a-chip (SoC or SOC) integrated circuit for use in mobile, handheld, or embedded devices.

An embodiment of system 500 can include, or be incorporated within a server-based gaming platform, a game console, including a game and media console, a mobile gaming console, a handheld game console, or an online game console. In some embodiments system 500 is a mobile phone, smart phone, tablet computing device or mobile Internet device. Data processing system 500 can also include, couple with, or be integrated within a wearable device, such as a smart watch wearable device, smart eyewear device, augmented reality device, or virtual reality device. In some embodiments, data processing system 500 is a television or set top box device having one or more processors 502 and a graphical interface generated by one or more graphics processors 508.

In some embodiments, the one or more processors 502 each include one or more processor cores 507 to process instructions which, when executed, perform operations for system and user software. In some embodiments, each of the one or more processor cores 507 is configured to process a specific instruction set 509. In some embodiments, instruction set 509 may facilitate Complex Instruction Set Computing (CISC), Reduced Instruction Set Computing (RISC), or computing via a Very Long Instruction Word (VLIW). Multiple processor cores 507 may each process a different instruction set 509, which may include instructions to facilitate the emulation of other instruction sets. Processor core 507 may also include other processing devices, such a Digital Signal Processor (DSP).

In some embodiments, the processor 502 includes cache memory 504. Depending on the architecture, the processor 502 can have a single internal cache or multiple levels of internal cache. In some embodiments, the cache memory is shared among various components of the processor 502. In some embodiments, the processor 502 also uses an external cache (e.g., a Level-3 (L3) cache or Last Level Cache (LLC)) (not shown), which may be shared among processor cores 807 using known cache coherency techniques. A register file 506 is additionally included in processor 502 which may include different types of registers for storing different types of data (e.g., integer registers, floating point registers, status registers, and an instruction pointer register). Some registers may be general-purpose registers, while other registers may be specific to the design of the processor 502.

In some embodiments, processor 502 is coupled to a processor bus 510 to transmit communication signals such as address, data, or control signals between processor 502 and other components in system 500. In one embodiment the system 500 uses an exemplary 'hub' system architecture, including a memory controller hub 516 and an Input Output (I/O) controller hub 530. A memory controller hub 516 facilitates communication between a memory device and other components of system 500, while an I/O Controller Hub (ICH) 530 provides connections to I/O devices via a local I/O bus. In one embodiment, the logic of the memory controller hub 516 is integrated within the processor.

Memory device 520 can be a dynamic random-access memory (DRAM) device, a static random-access memory (SRAM) device, flash memory device, phase-change memory device, or some other memory device having suitable performance to serve as process memory. In one embodiment the memory device 520 can operate as system memory for the system 500, to store data 522 and instructions 521 for use when the one or more processors 502 executes an application or process. Memory controller hub 516 also couples with an optional external graphics processor 512, which may communicate with the one or more graphics processors 508 in processors 502 to perform graphics and media operations.

In some embodiments, ICH 530 enables peripherals to connect to memory device 520 and processor 502 via a high-speed I/O bus. The I/O peripherals include, but are not limited to, an audio controller 546, a firmware interface 528, a wireless transceiver 526 (e.g., Wi-Fi, Bluetooth), a data storage device 524 (e.g., hard disk drive, flash memory, etc.), and a legacy I/O controller 540 for coupling legacy (e.g., Personal System 2 (PS/2)) devices to the system. One or more Universal Serial Bus (USB) controllers 542 connect input devices, such as keyboard and mouse 544 combinations. A network controller 534 may also couple to ICH 530. In some embodiments, a high-performance network controller (not shown) couples to processor bus 510. It will be appreciated that the system 500 shown is exemplary and not limiting, as other types of data processing systems that are differently configured may also be used. For example, the I/O controller hub 530 may be integrated within the one or more processor 502, or the memory controller hub 516 and I/O controller hub 530 may be integrated into a discreet external graphics processor, such as the external graphics processor 512.

The following examples are provided to further illustrates embodiments of the disclosure. The following examples are non-limiting and illustrative in purpose.

Example 1 is directed to a system to provide in-field testing to diagnose components, the system comprising: a memory circuitry; a diagnostic component in communication with the memory, the diagnostic component configured to test the memory for ECC/Parity check; an array test controller to communicate with the memory circuit and the at least one diagnostic component, the array test controller configured to: generate a test vector for in-field diagnostic of one or more of the memory circuitry and the diagnostic component; transmit the test vector to one or more of the diagnostic component and the memory circuitry; receive a response to the test vector from one of the memory circuitry or the diagnostic component; and detect an error by comparing the received response with the test vector.

Example 2 is directed to the system of example 1, wherein the array test controller is further configured to store the received response.

Example 3 is directed to the system of example 1, wherein the test vector is one of pseudorandom test vector or a random test vector.

Example 4 is directed to the system of example 1, wherein the array test controller is further configured to generate and transmit a first pseudo-random test vector and a second random test vector, wherein the first test vector is configured to detect a fault in the memory circuitry and wherein the second test vector is configured to detect a fault in the diagnostic component.

Example 5 is directed to the system of example 1, wherein the array test controller is configured to generate and transmit the test vector during runtime.

Example 6 is directed to the system of example 1, wherein the diagnostic component comprises a hardware or a software component.

Example 7 is directed to the system of example 1, wherein the diagnostic component comprises one or more of an Error Code Correction (ECC) processor logic, a combinatorial logic processor, a flip-flop circuitry, a memory register, an encoder circuit and a decoder circuit.

Example 8 is directed to the system of example 1, wherein the test vector is configured to parity check a processor logic.

Example 9 is directed to the system of example 1, wherein the test vector is configured to detect a single bit error or a multi-bit error.

Example 10 is directed to the system of example 1, wherein the array test controller conducts Memory Built-In Self-Test.

Example 11 is directed to at least one machine-readable medium comprising instructions that, when executed by computing hardware, including a processor coupled to a data store and to a plurality of data capture devices, cause the computing hardware to cause a System-on-Chip (SoC) to perform steps including: generating one or more test vectors at a controller to test at least one or more of the memory structure and a logical component; transmitting the one or more test vectors to a respective one or more memory locations and the logical component; receiving one or more responses from each of the respective one or more of the memory or logical components; storing the received one or more responses at a secondary memory location; and detecting an error in one of the received responses corresponding to a memory location; wherein the test vectors include pseudorandom test vectors and random test vectors.

Example 12 is directed to the machine-readable medium of example 11, further comprising responding to the detected error.

Example 13 is directed to the machine-readable medium of example 11, wherein the random test vectors are inputted in to the system.

Example 14 is directed to the machine-readable medium of example 11, wherein each of the random test vectors are generated and transmitted during runtime.

Example 15 is directed to the machine-readable medium of example 11, wherein the self-diagnostic test is run concurrently with an array memory built-in self-testing (MBIST) memory array testing and wherein the self-diagnostic test is implemented using one or more of random and pseudorandom vectors.

Example 16 is directed to the machine-readable medium of example 11, wherein the logical component comprises a hardware or a software component associate with an Internet of Things (IoT) system.

Example 17 is directed to the machine-readable medium of example 11, wherein the logical component comprises one or more of an Error Code Correction (ECC) processor logic, a combinatorial logic processor, a flip-flop circuitry, a memory register, an encoder circuit and a decoder circuit.

Example 18 is directed to the machine-readable medium of example 11, wherein at least one or more of the random test vectors and pseudorandom test vectors are configured to parity check a processor logic.

Example 19 is directed to the machine-readable medium of example 11, wherein generating one or more test vectors further comprises randomly generating a plurality of test vectors including at least one single bit test vector and at least one multi-bit test vector.

Example 20 is directed to the machine-readable medium of example 11, wherein generating one or more test vectors at a controller further comprises generating a pseudorandom test vector at an MBIST controller circuitry.

Example 21 is directed to a method to run a self-diagnostic test on a memory array, the method comprising: generating one or more test vectors at a controller to test at least one or more of the memory structure and a logical component; transmitting the one or more test vectors to a respective one or more memory locations and the logical component; receiving one or more responses from each of the respective one or more of the memory or logical components; storing the received one or more responses at a secondary memory location; and detecting an error in one of the received responses corresponding to a memory location; wherein the test vectors include pseudorandom test vectors and random test vectors.

Example 22 is directed to the method of example 21, further comprising responding to the detected error.

Example 23 is directed to the method of example 21, wherein the random test vectors are inputted in to the system.

Example 24 is directed to the method of example 21, wherein each of the random test vectors are generated and transmitted during runtime.

Example 25 is directed to the method of example 21, wherein the self-diagnostic test is run concurrently with an array memory built-in self-testing (MBIST) memory array testing and wherein the self-diagnostic test is implemented using one or more of random and pseudorandom vectors.

Example 26 is directed to the method of example 21, wherein the logical component comprises a hardware or a software component associate with an Internet of Things (IoT) system.

Example 27 is directed to the method of example 21, wherein the logical component comprises one or more of an Error Code Correction (ECC) processor logic, a combinatorial logic processor, a flip-flop circuitry, a memory register, an encoder circuit and a decoder circuit.

Example 28 is directed to the method of example 21 wherein at least one or more of the random test vectors and pseudorandom test vectors are configured to parity check a processor logic.

Example 29 is directed to the method of example 21, wherein generating one or more test vectors further comprises randomly generating a plurality of test vectors including at least one single bit test vector and at least one multi-bit test vector.

Example 30 is directed to the method of example 21, wherein generating one or more test vectors at a controller further comprises generating a pseudorandom test vector at an MBIST controller circuitry.

Embodiments described above illustrate but do not limit this application. While a number of exemplary aspects and embodiments have been discussed above, those of skill in the art will recognize certain modifications, permutations, additions and sub-combinations thereof. Accordingly, the scope of this disclosure is defined only by the following claims.

What is claimed is:

1. A system to provide in-field testing to diagnose components, the system comprising:
   a memory circuitry;
   a diagnostic component in communication with the memory circuitry, the diagnostic component configured to test the memory circuitry for Error Code Correction (ECC)/Parity check;
   an array test controller to communicate with the memory circuitry and the diagnostic component, the array test controller configured to:
      generate a random test vector and a pseudo random test vector for in-field diagnostic of the memory circuitry and the diagnostic component;
      transmit the pseudorandom test vector to the memory circuitry and transmit the random test vector to the diagnostic component, each of the memory circuitry and the diagnostic component generating a respective vector response;
      receive the test vector responses from each of the memory circuitry and the diagnostic component; and
      detect an error by comparing the received test vector responses with their respective test vectors;
   wherein the memory circuitry and the diagnostic component are tested in parallel.

2. The system of claim 1, wherein the array test controller is further configured to store the test vector responses.

3. The system of claim 1, wherein the array test controller is configured to generate and transmit the test vectors during runtime.

4. The system of claim 1, wherein the diagnostic component comprises a hardware or a software component.

5. The system of claim 1, wherein the diagnostic component comprises one or more of an Error Code Correction (ECC) processor logic, a combinatorial logic processor, a flip-flop circuitry, a memory register, an encoder circuit and a decoder circuit.

6. The system of claim 1, wherein the test vectors are configured to parity check a processor logic.

7. The system of claim 1, wherein the test vectors are configured to detect a single bit error or a multi-bit error.

8. The system of claim 1, wherein the array test controller conducts Memory Built-In Self-Test.

9. At least one non-transitory machine-readable medium comprising instructions that, when executed by computing hardware, including a processor coupled to a data store and to a plurality of data capture devices, cause the computing hardware to cause a System-on-Chip (SoC) to perform steps comprising:
   generating a random test vector and a pseudo random test vector at a controller to test at least one of a memory structure and a logical component;
   transmitting the random test vector to the logical component and transmitting the pseudorandom test vector to the memory structure;
   receiving a respective test vector response from each of the logical component and the memory structure;
   storing the received test vector responses at a secondary memory location; and
   detecting an error in the received test vector responses corresponding to a tested memory structure location;
   wherein the memory structure and the logical component are tested in parallel.

10. The machine-readable medium of claim 9, further comprising responding to the detected error.

11. The machine-readable medium of claim 9, wherein the test vectors are generated and transmitted during runtime.

12. The machine-readable medium of claim 9, wherein the steps of generating, transmitting, storing and detecting an error are run concurrently with an array memory built-in self-testing (MBIST) memory array testing and wherein the self-diagnostic test is implemented using the at least one of random and pseudorandom vectors.

13. The machine-readable medium of claim 9, wherein the logical component comprises a hardware or a software component associate with an Internet of Things (IoT) system.

14. The machine-readable medium of claim 9, wherein the logical component comprises one or more of an Error Code Correction (ECC) processor logic, a combinatorial logic processor, a flip-flop circuitry, a memory register, an encoder circuit and a decoder circuit.

15. The machine-readable medium of claim 9, wherein the test vectors are configured to parity check a processor logic.

16. The machine-readable medium of claim 9, wherein the step of generating a test vector further comprises randomly generating a plurality of test vectors including at least one single bit test vector and at least one multi-bit test vector.

17. A method to run a self-diagnostic test on a memory structure, the method comprising:
   generating a random test vector and a pseudo random test vector at a controller to test at least one of the memory structures and a logical component;
   transmitting the random test vector to the logical component and transmitting the pseudorandom test vector to the memory structure;
   receiving a respective test vector response from each of the logical component and the memory structure;
   storing the received test vector response at a secondary memory location; and
   detecting an error in the received test vector response from the memory structure corresponding to a memory location of the memory structure;
   wherein the memory structure and the diagnostic component are tested in parallel.

18. The method of claim 17, further comprising responding to the detected error.

19. The method of claim 17, wherein each of the random and pseudorandom test vectors are generated and transmitted during runtime.

20. The method of claim 17, wherein the steps of generating, transmitting, receiving and detecting are run concurrently with an array memory built-in self-testing of the memory structure.

21. The method of claim 17, wherein the logical component comprises a hardware or a software component associate with an internet of Things (IoT) system.

22. The method of claim 17, wherein the logical component comprises one or more of an Error Code Correction (ECC) processor logic, a combinatorial logic processor, a flip-flop circuitry, a memory register, an encoder circuit and a decoder circuit.

23. The method of claim 17, wherein at least one of the random test vectors or the pseudorandom test vector is configured to parity check a processor logic.

24. The method of claim 17, wherein at least one of the random test vectors or the pseudorandom test vector further comprises at least one of a single bit test vector or a multi-bit test vector.

25. The method of claim 17, wherein generating a pseudorandom test vector further comprises generating a pseudorandom test vector at an MBIST controller circuitry.

* * * * *